Aug. 16, 1966 D. H. RUMBLE 3,267,298

WAVEFORM CONVERTER

Filed Nov. 25, 1964

INVENTOR
DALE H. RUMBLE

BY Donald O. Nei

AGENT

United States Patent Office 3,267,298
Patented August 16, 1966

3,267,298
WAVEFORM CONVERTER

Dale H. Rumble, Saugerties, N.Y., assignor to International Business Machines Corporation, Armonk, N.Y., a corporation of New York Filed Nov. 25, 1964, Ser. No. 413,741
6 Claims. (Cl. 307—88.5)

This invention relates to electrical waveform conversion and more particularly to the conversion of a square waveform to a sinusoidal waveform of the same fundamental frequency.

Converters of the type which permit a sinusoidal waveform to be produced from a square waveform are known in the art. However, as those skilled in the art will appreciate, the existing converters have attendant disadvantages which limit their application or otherwise make their use less than completely satisfactory.

One prior art approach, by far the most popular one, utilizes a passive filter network tuned to the fundamental frequency of the square waveform to be converted. However, the disadvantages of this approach are numerous. Specifically, the extraction from the square waveform of a relatively pure undistorted sinusoidal waveform generally requires many stages of filtering, each stage of which introduces phase lags and signal attenuation. The sinusoidal waveform finally derived must then be phase shifted and amplified to restore it to its preconversion phase and signal level. Clearly, the multiple stages and additional phase correction and amplification means required with the prior art passive filter converters add complexity and cost to the converter.

It is, therefore, an object of this invention to provide an improved circuit for converting square waveforms to sinusoidal waveforms which overcomes the above-mentioned shortcomings of the prior art.

It is another object of this invention to provide a waveform converter which consists of but a single stage.

It is still another object of this invention to provide a waveform converter which operates with negligible attenuation of the input waveform.

It is a further object of this invention to provide a waveform converter which introduces negligible undesired phase shift of the input waveform.

It is a still further object of this invention to provide a waveform converter which, although not generally introducing a phase shift of the input waveform, permits independent control of the phase of the output waveform.

It is yet another object of this invention to provide a waveform converter which is simply constructed and which requires neither many nor expensive, high tolerance components.

It is still another object of this invention to provide a waveform converter which produces a sinusoidal waveform having negligible distortion.

Since applications for which this technique will be used generally are low impedance circuits (specifically, the high speed and fast response applications) it is the object of this invention to provide a waveform converter having a low impedance input and low impedance output for the respective input and output signals.

It is a further object of this invention to provide a waveform converter which accomplishes all the above-mentioned objects but is not restricted in its use to any greater extent than prior art converters of the same general type.

Therefore, in accordance with one aspect of this invention, I provide a novel combination of circuit elements for converting a square waveform of a specified fundamental frequency into a sinusoidal waveform of the same specified frequency. The combination comprises a suitably biased transistor which receives at its emitter the square waveform input and converts it to a sinusoidal waveform output at the collector. The conversion is achieved by placing in the base circuit a frequency-dependent impedance means which exhibits low impedance to signals of the fundamental frequency and the low order harmonics thereof, and high impedance to signals of other frequencies. The effect of this frequency-dependent impedance means is to selectively amplify the frequencies in the neighborhood of the fundamental frequency to a much greater extent than other frequencies. This results in a sinusoidal waveform being produced at the collector which is substantially free of hermonics and which is, therefore, of relatively high purity.

In accordance with another aspect of this invention, I provide the waveform converter circuit described in the preceding paragraph with a second frequency-dependent impedance means located in the emitter circuit. This impedance means exhibits high impedance to high order harmonics of the fundamental frequency of the square waveform. One result of using this impedance means is that square waveforms having extremely short rise times can be converted in one stage to relatively pure sinusoidal waveforms without producing any instability in the converter.

In accordance with a further aspect of this invention, either of the converter embodiments described above can be provided with variable capacitance means in the base circuit for varying the phase relationship between the input and output waveforms.

Numerous advantages have been found to flow from this invention. For example, the waveform converter can be adapted for use with square waveforms of a broad range of frequencies by making extremely simple adjustments in certain of the circuit parameters. Additionally, the converter has been found to be quite stable under varying conditions of operation. Also, the converter, because of its simplicity, lends itself to manufacture by mass production techniques resulting in even greater saving per unit than possible with prior art converters. Finally, along with all the above advantages, the waveform converter is still suitable for use in the applications that prior art converters of this same general type are presently being used in.

The foregoing and other objects, features and advantages of the invention will be apparent from the following more particular description of a preferred embodiment of the invention, as illustrated in the accompanying drawings.

Figure 1:
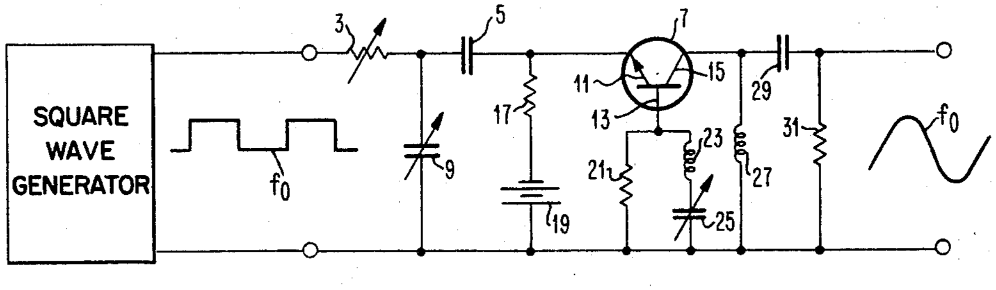
FIG. 1 represents a preferred embodiment of a waveform converter circuit constructed in accordance with the principles of this invention.

Referring now to FIG. 1, a preferred embodiment of a waveform converter constructed in accordance with the principles of this invention is depicted. To supply the converter circuit with a source of square waves, a square wave generator 1 is provided. This generator may be of any suitable type commercially available and may, for example, be constructed in accordance with the principles of Section 5–10, Pulse and Digital Circuits, by Millman and Taub (McGraw-Hill Book Co., Inc., 1956). Of course, it will be understood that the particular source from which the square waves to be converted are obtained is of no consequence to this invention.

Connected in series with the square wave source 1 is a resistor 3 and a capacitor 5. The resistor is preferably a variable resistor which can then be varied in accordance with the impedance of the square wave source 1 to facilitate impedance matching of the converter circuit and the source. The capacitor 5 is a coupling capacitor which insures that only A.C. signals reach the emitter circuit of the transistor 7. To attenuate high order harmonics of square waves having extremely short rise times, an RC network is formed in the emitter circuit of the transistor 7 by adding a capacitor 9 in shunt with the square wave source 1. The RC network comprising the resistor 3 and the capacitor 9 can be tuned to attenuate the undesired high harmonics of the square wave. It will be understood by those skilled in the art that the RC network will be unnecessary when the rise time of a square wave is other than extremely short in duration. As a guide, it has been found that pre-filtering via the use of an RC network in the emitter circuit is desirable only when the rise time of the input square wave in μsec. is significantly less than 0.05 of the fundamental frequency of the input square wave.

A transistor 7 having an emitter electrode 11, a base electrode 13 and a collector electrode 15 is provided to receive the filtered square wave. The transistor, which is connected in the common base configuration, is of the NPN type. The only requirement of the transistor 7 is that its frequency response exceed the fundamental frequency of the input square wave. Suitable biasing means comprising a resistor 17 and a voltage source 19 are serially connected between the emitter electrode 11 and ground. The biasing means is adjusted to bias the transistor into conduction, i.e., into the active region, where it remains throughout the waveform conversion process. Of course, it will be understood by those skilled in the art that a PNP transistor could be utilized equally as well, the only change being required is a change in polarity of the biasing means.

To selectively amplify signals of the fundamental frequency and low order harmonics, a frequency-dependent impedance means is connected in the base circuit of the transistor between the base electrode 13 and ground. This impedance means comprises a resistor 21 connected in parallel with the serial combination of an inductor 23 and a variable capacitor 25. An LCR combination such as the one of the preferred embodiment can be tuned in a manner to be described hereinafter so that the transistor stage selectively amplifies the fundamental frequency of the input square wave and low order harmonics. By comparison, this selective amplification results in a relative attenuation of the high order harmonics, thereby providing a pure sinusoidal signal at the collector electrode 15. If phase variation of the output sinusoidal wave relative to the input square wave is desired, the ratio of the inductance of the inductor 23 to the capacitance of the capacitor 25 should be large. A large $L/C$ ratio permits the phase of the output sinusoidal wave to be shifted as much as 90° by simply varying the capacitance of the capacitor 25.

Since it is often desirable to match the output impedance of a stage to the input impedance of the stage, impedance means are connected in the collector circuit. With the same impedance at the output of the converter as at the input thereof, it is possible to insert the converter in an electrical system, provided the impedance of the converter is matched with the system to which it is connected, without introducing undesirable disturbances in the system. With the above in mind, an inductor 27 connected between the collector electrode 15 and ground is added to the converter circuit along with a capacitor 29 and a resistor 31. The capacitor 29 is connected in series with the collector electrode 15, and the resistor 31 is connected between the collector electrode 15 and ground. As will be understood by those skilled in the art, the particular values of inductance, capacitance, and resistance for collector circuit elements 27, 29 and 31, respectively, will vary depending on the impedance of the emitter circuit and the degree of impedance match desired. Of course, as those skilled in the art will appreciate, it is desirable to make the LC time constant of the inductor 27 and capacitor 29 sufficiently large with respect to the period of the fundamental in order to avoid introducing distortion into the output sinusoidal wave appearing at the collector electrode 15.

The structure of a preferred embodiment of the waveform converter having been discribed, the factors to be considered in selecting values for the circuit elements of the converter will now be set forth. Assuming, for the purposes of discussion, that a source of square waves having a frequency of 2 mc. and a rise time of 0.001 μsec. is utilized. Since the rise time of the square wave is relatively short, it is preferable to filter out the high order harmonics of the fundamental frequency of the square wave. This filtering is in accord with the guide discussed earlier, i.e., filtering of high order harmonics is desirable when the rise time of the square wave in μsec. is significantly less than 0.05 of the fundamental frequency. Knowing the impedance of the square wave pulse source and also that it is desired to filter the high order harmonics, values for the resistor 3 and capacitor 9 of the RC low pass filter configuration may be selected to satisfy the impedance matching and filtering requirements. As stated previously, the values of the resistor 31, the capacitor 29 and the inductor 27, will be chosen to match the impedance of the input circuit and to give a time constant sufficiently large to avoid distortion of the output sinusoidal wave present at the collector electrode 15. The values of the remaining circuit elements, i.e., of the biasing means and the frequency-dependent impedance means in the base circuit, can be easily selected. A detailed description of the selection process for the base circuit elements will be given hereinafter. At this point, it is sufficient to know that the value of inductance of the inductor 23 is made much greater than the value of the capacitance of capacitor 25, so as to make the base circuit relatively insensitive to variations in the capacitance of capacitor 25 introduced when altering the phase relationships of the input and output signals. Once having selected these values, the biasing means can then be adjusted to bias the circuit into the conductive or active region. The coupling capacitors 5 and 29 have values adjusted for filtering out the D.C. components. Finally, transistor 7 can be of any suitable type having a frequency response greater than the fundamental frequency of the square wave.

Figure 2:
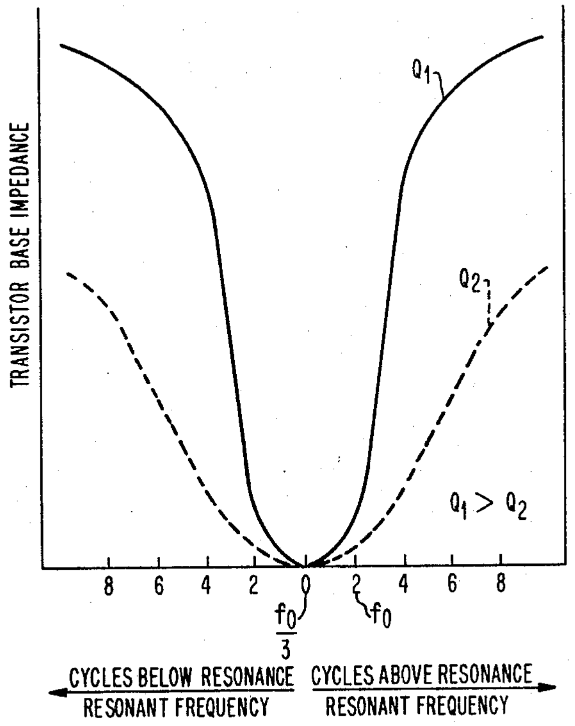
FIG. 2 represents a plot of the impedance of the base circuit of the transistor as a function of the ratio of cycles off resonance ot the resonant frequency. This plot depicts qualitatively the manner in which the desired frequencies are selectively amplified, thereby producing a relatively pure sinusoidal waveform at the collector.

Representative numerical values for the various circuit elements used in conjunction with a 2 mc. square wave source having a rise time of 0.001 μsec. and which are designed to provide unity gain for the sinusoidal wave measured peak to peak are as follows:

$R_3$—set at 100 ohms
$C_5$—0.01 μfd.
$C_9$—set at 4700 pfd. for 0.001 μsec. rise time
$T_7$—2N914
$R_{17}$—100 ohms
$V_{19}$—6 volts
$R_{21}$—82,000 ohms
$L_{23}$—1 millihenry
$C_{25}$—25–70 pfd.
$L_{27}$—1 millihenry
$C_{29}$—0.01 μfd.
$R_{31}$—82 ohms The operation of the converter circuit can best be illustrated by referring to FIG. 2, which shows a plot of base circuit impedance versus the ratio of cycles off resonance to resonant frequency. Referring to the curve $Q_1$, it is seen that it is possible to tune a high Q base circuit to a subharmonic $fo/3$ of the fundamental $fo$ and thereby provide a base circuit which affords a lower impedance to the fundamental than to the higher harmonics. The gain of a transistor connected in the common base configuration for signals of different frequencies is inversely proportional to the impedance of the base for the respective frequencies. Thus, if the base circuit, as in the example herein, is tuned to $fo/3$, the transistor will amplify signals having a frequency in the neighborhood of $fo/3$ to a much greater extent than it will amplify high order harmonics, simply because as to the high order harmonics the base circuit exhibits very large impedance. Specifically, it has been found that a converter connected to a 2 mc. source of square waves having 0.001 μsec. rise time should preferably have its base circuit tuned to ⅔ mc. Tuning at this value, providing the Q of the base circuit is sufficiently high, will result in a selective amount of amplification of the fundamental, thereby producing a sinusoidal waveform at the collector substantially free of high order harmonics.

As will be understood by those skilled in the art, as the value of Q is reduced from, for example, $Q_1$ to $Q_2$ (see FIG. 2), the impedance in the base circuit to high order harmonics is reduced resulting in greater amplification of these frequencies by the transistor in accordance with the operation of a grounded base transistor amplifier configuration. And, as the high order harmonics become amplified to greater extents, the amplified signal at collector becomes richer in harmonics and the sinusoidal wave becomes more distorted. Thus, it is preferable to provide a base circuit having a high Q because it results in a selective amplification of frequencies in the neighborhood of the fundamental giving a purer sinusoidal output at the collector. However, as those skilled in the art will further appreciate, since the base circuit must be able to draw current in order for the transistor to operate, the value of the resistor 21 by which such operation is possible is chosen on the basis of transistor biasing as well as base circuit Q requirements.

Referring again to FIG. 1, and assuming that the square wave source has a fundamental frequency $fo$ of 2 mc., and that the base circuit has a $Q=Q_1$ (see FIG. 2) and is tuned to a frequency $fo/3$, the operation of the circuit will be described. The high order harmonics of the square waves input to the emitter circuit of the transistor are filtered by the RC filter means including the resistor 3 and the capacitor 9. In addition, the D.C. component is filtered by the coupling capacitor 5. The resultant signal, free of high order harmonics and D.C. components, is fed into the emitter electrode 11. However, the base circuit, being tuned to $fo/3$ and having a high Q, results in amplification of the fundamental $fo$ to a much greater extent than other frequency components of the filtered signal at the emitter electrode. Hence, the amplified signal appearing at the collector electrode 15 is substantially free of high order harmonics and, therefore, is a very pure sinusoidal wave of frequency $fo$. This sinusoidal signal then passes through the output impedance means including inductor 27, capacitor 29 and resistance 31. It will be remembered that the LC constant of the output impedance means is large relative to the period of the sinusoidal signal and, therefore, introduces negligible distortion into the converted waveform.

If it is desired to vary the phase of the output sinusoidal signal relative to the input square wave, the capacitor 25 may be varied. Since the inductance of the inductor 23 is much greater than the capacitance of capacitor 25, a high $L/C$ ratio existing, variations introduced by altering the capacitance of the capacitor 25 have a significant effect on the magnitude of the phase of the output sine wave. Specifically, a variation of ±45° can be obtained within the range of the value of $C_{25}$ shown.

While the invention has been particularly shown and described with reference to a preferred embodiment thereof, it will be understood by those skilled in the art that the foregoing and other changes in form and details may be made therein without departing from the spirit and scope of the invention.

I claim:

1. A circuit for converting a square waveform having a specified fundamental frequency to a sinusoidal waveform of the same specified fundamental frequency, said circuit comprising:

a square wave signal source supplying the square waveform to be converted; a transistor having base, emitter, and collector electrodes, said emitter electrode being connected to said square wave signal source;

frequency-dependent impedance means, said impedance means being connected to said base electrode and exhibiting low impedance to signals of said specified fundamental frequency and to low order harmonics of said specified fundamental frequency, and exhibiting high impedance to other signals;

transistor biasing means including a voltage source connected between said emitter electrode and said impedance means for biasing said transistor into conduction; and output circuit means connected between said collector electrode and said frequency-dependent impedance means for providing said sinusoidal waveform.

2. A circuit for converting a square waveform having a specified fundamental frequency to a sinusoidal waveform of the same specified fundamental frequency, said circuit comprising:

a square wave signal source supplying the square waveform to be converted; a transistor having base, emitter, and collector electrodes, said emitter electrode being connected to said square wave signal source;

resonant circuit means including an inductance and capacitance connected in series to said base electrode, said resonant circuit means exhibiting low impedance to signals of said specified fundamental frequency and to low order harmonics of said specified fundamental frequency, and exhibiting high impedance to other signals;

transistor biasing means including a voltage source connected to said emitter and said resonant circuit for biasing said transistor into conduction; and output circuit means connected to said collector electrode and to said resonant circuit means for providing said sinusoidal waveform.

3. A circuit for converting a square waveform input signal having a specified fundamental frequency to a sinusoidal waveform output signal of the same specified fundamental frequency, said circuit comprising:

a transistor having base, emitter, and collector electrodes;

a frequency-dependent impedance means, including an inductance and a variable capacitance means, connected in series to said base electrode, said impedance means exhibiting low impedance to signals of said specified fundamental frequency and to low order harmonics of said specified fundamental frequency and exhibiting high impedance to other signals;

trasistor biasing means including a voltage source connected between said emitter and said impedance means for biasing said transistor into conduction; and output circuit means connected between said collector electrode and said impedance means for providing said sinusoidal waveform output signal, the phase relationship of said output signal with respect to said input signal being adjustable by varying the capacitance of said capacitance means.

4. A circuit for converting a square waveform signal input having a specified fundamental frequency to a sinusoidal waveform signal output of the same specified fundamental frequency, said circuit comprising:

a transistor having base, emitter and collector electrodes;

a first frequency-dependent impedance means, said impedance means being connected to said base electrode and exhibiting low impedance to signals of said specified fundamental frequency to to low order harmonics of said specified fundamental frequency, and exhibiting high impedance to other signals;

transistor biasing means including a voltage source connected between said emitter electrode and said first impedance means for biasing said transistor into conduction;

a second frequency-dependent impedance means connected to said emitter electrode, said second impedance means exhibiting high impedance to high order harmonics of said specified fundamental frequency; and an output circuit means connected to said collector electrode and to said first frequency-dependent impedance means for providing said sinusoidal waveform signal output.

5. A circuit for converting a square waveform having a specified fundamental frequency to a sinusoidal waveform of the same specified fundamental frequency, said circuit comprising:

a transistor having base, emitter and collector electrodes;

a frequency-dependent impedance means connected to said base electrode, said impedance means comprising a resistance means connected in parallel circuit arrangement with the combination of serially connected inductance and capacitance means, said impedance means exhibiting low impedance to signals of said specified fundamental frequency and to low order harmonics of said specified fundamental frequency, and exhibiting high impedance to other signals;

transistor biasing means including a voltage source connected to said emitter and said frequency-dependent impedance means for biasing said transistor into conduction; and output circuit means connected to said collector electrode and to said frequency-dependent impedance means circuit means for providing said sinusoidal waveform.

6. A circuit for converting a square waveform input signal having a specified fundamental frequency to a sinusoidal waveform output signal of the same specified fundamental frequency, said circuit comprising:

a transistor having base, emitter and collector electrodes;

a first frequency-dependent impedance means connected to said base electrode, said impedance means comprising a resistance means connected in parallel circuit arrangement with the combination of serially connected inductance and variable capacitance means, said impedance means exhibiting low impedance to signals of said specified fundamental frequency and to low order harmonics of said specified frequency, and exhibiting high impedance to other signals;

transistor biasing means including a voltage source connected to said emitter and said first frequency-dependent impedance means for biasing said transistor into conduction;

a second frequency-dependent impedance means connected to said emitter electrode, said second impedance exhibiting high impedance to high order harmonics of said specified fundamental frequency; and an output circuit means connected to said collector electrode and to said first impedance means for providing said sinusoidal waveform output signal, the phase relationship of said output signal with respect to said input signal being adjustable by varying the capacitance of said capacitance means.

References Cited by the Examiner

UNITED STATES PATENTS

| | | | |
|---|---|---|---|
| 2,727,146 | 12/1955 | Fromm | 307—88.5 |
| 2,775,705 | 12/1956 | Van Overbeek | 307—88.5 |

ARTHUR GAUSS, *Primary Examiner.*

J. ZAZWORSKY, *Assistant Examiner.*